US010794813B2

(12) United States Patent
Hentz et al.

(10) Patent No.: US 10,794,813 B2
(45) Date of Patent: Oct. 6, 2020

(54) MICRO OR NANOMECHANICAL PARTICLE DETECTION DEVICE

(71) Applicant: COMMISSARIAT A L'ENERGIE ATOMIQUE ET AUX ENERGIES ALTERNATIVES, Paris (FR)

(72) Inventors: Sebastien Hentz, Seyssinet-Pariset (FR); Marc Sansa Perna, Castelar del Valles (ES)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/237,817

(22) Filed: Jan. 2, 2019

(65) Prior Publication Data
US 2019/0204205 A1  Jul. 4, 2019

(30) Foreign Application Priority Data

Jan. 3, 2018 (FR) ..................... 18 50025

(51) Int. Cl.
*G01N 15/14* (2006.01)
*G01P 15/08* (2006.01)
(Continued)

(52) U.S. Cl.
CPC ............ *G01N 15/14* (2013.01); *G01H 13/00* (2013.01); *G01L 1/103* (2013.01); *G01L 1/18* (2013.01);
(Continued)

(58) Field of Classification Search
CPC ........ G01D 5/266; G01D 5/268; G01H 11/08; G01H 13/00; G01H 9/00; G01L 1/103;
(Continued)

(56) References Cited

U.S. PATENT DOCUMENTS 5,208,458 A * 5/1993 Busch ............... G01N 1/34
250/281
2008/0165402 A1* 7/2008 Nakamura ........... B81B 3/0021
359/198.1
(Continued)

FOREIGN PATENT DOCUMENTS

EP  3 147 673 A1  3/2017

OTHER PUBLICATIONS

French Search Report dated Sep. 27, 2018 in French Application 1850025, filed Jan. 3, 2018 (with English Translation of Categories of Cited Documents).

(Continued)

*Primary Examiner* — Hina F Ayub
(74) *Attorney, Agent, or Firm* — Oblon, McClelland, Maier & Neustadt, L.L.P.

(57) ABSTRACT

Particle detection device comprising a support, a platform for receiving particles, four beams suspending the platform from the support, such that the platform can be made to vibrate, means for making said platform vibrate at a resonance frequency, means for detecting the displacement of the platform in a direction of displacement. Each beam has a length l, a width L and a thickness e and the platform has a dimension in the direction of displacement of the platform and in which in a device with out of plane mode l≥10×L and the dimension of each beam in the direction of displacement of the platform is at least 10 times smaller than the dimension of the platform in the direction of displacement.

23 Claims, 7 Drawing Sheets

(51) Int. Cl.
*G01L 1/18* (2006.01)
*G01L 1/10* (2006.01)
*G01H 13/00* (2006.01)
*H01J 49/26* (2006.01)
*G01N 15/10* (2006.01)
*H03H 9/24* (2006.01)
*G01D 5/26* (2006.01)
*H03H 9/02* (2006.01)
*G01H 11/08* (2006.01)
*G01H 9/00* (2006.01)

(52) U.S. Cl.
CPC .......... *G01P 15/0802* (2013.01); *H01J 49/26* (2013.01); *G01D 5/266* (2013.01); *G01D 5/268* (2013.01); *G01H 9/00* (2013.01); *G01H 11/08* (2013.01); *G01N 2015/1043* (2013.01); *H03H 9/02338* (2013.01); *H03H 2009/2442* (2013.01)

(58) Field of Classification Search
CPC .. G01L 1/18; G01N 15/14; G01N 2015/1043; G01P 15/0802; H01J 49/26; H03H 2009/2442; H03H 9/02338
See application file for complete search history.

(56) References Cited

U.S. PATENT DOCUMENTS

| | | | |
|---|---|---|---|
| 2009/0185133 A1* | 7/2009 | Sakakibara | G02B 26/0833 351/211 |
| 2011/0222157 A1* | 9/2011 | Sano | G01J 3/26 359/578 |
| 2016/0047677 A1* | 2/2016 | Heidrich | G01N 21/7746 356/480 |
| 2017/0089944 A1 | 3/2017 | Duraffourg | |

OTHER PUBLICATIONS

Rahafrooz, A. et al. "Fabrication and characterization of thermally actuated micromechanical resonators for airborne particle mass sensing: I. Resonator design and modeling", Journal of Micromechanics and Microengineering vol. 20, No. 12, P. 125018, 2010, pp. 1-10.
Hajjam, A. et al. "Fabrication and characterization of thermally actuated micromechanical resonators for airborne particle mass sensing: II. Device fabrication and characterization", Journal of Micromechanics and Microengineering vol. 20, No. 12, P. 125019, 2010, pp. 1-10.
Hajjam, A. et al. "Thermally Actuated MEMS Resonant Sensors for Mass Measurement of Micro/Nanoscale Aerosol Particles", IEEE Sensors, 2009, pp. 707-710.
Soysal, U. et al. "Aerosol mass concentration measurements: Recent advancements of real-time nano/micro systems", Journal of Aerosol Science vol. 114, 2017, pp. 42-54.
Khine, L. et al. "High-Q bulk-mode SOI square resonators with straight-beam anchors", Journal of Micromechanics and Microengineering vol. 19, No. 1, 2009, pp. 1-10.
Angel, T-H. et al. "Electrostatically Transduced Face-Shear Mode Silicon Mems Microresonator", Frequency Control Symposium (FCS), IEEE, 2010, pp. 534-538.
U.S. Appl. No. 14/519,353, filed Oct. 21, 2014, US 2015/0107336 A1, Hentz, S., et al.
U.S. Appl. No. 15/389,605, filed Dec. 23, 2016, US 2017/0183221 A1, Ludurczak, W., et al.
U.S. Appl. No. 15/499,292, filed Apr. 27, 2017, US 2017/0314973 A1, Leoncino, L., et al.

* cited by examiner

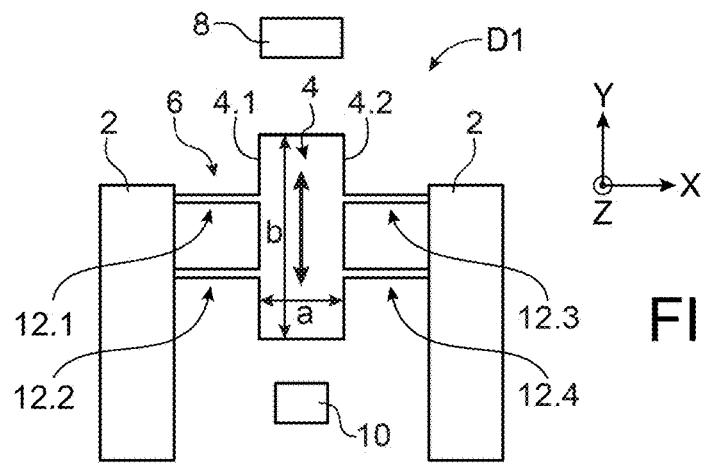
FIG.1
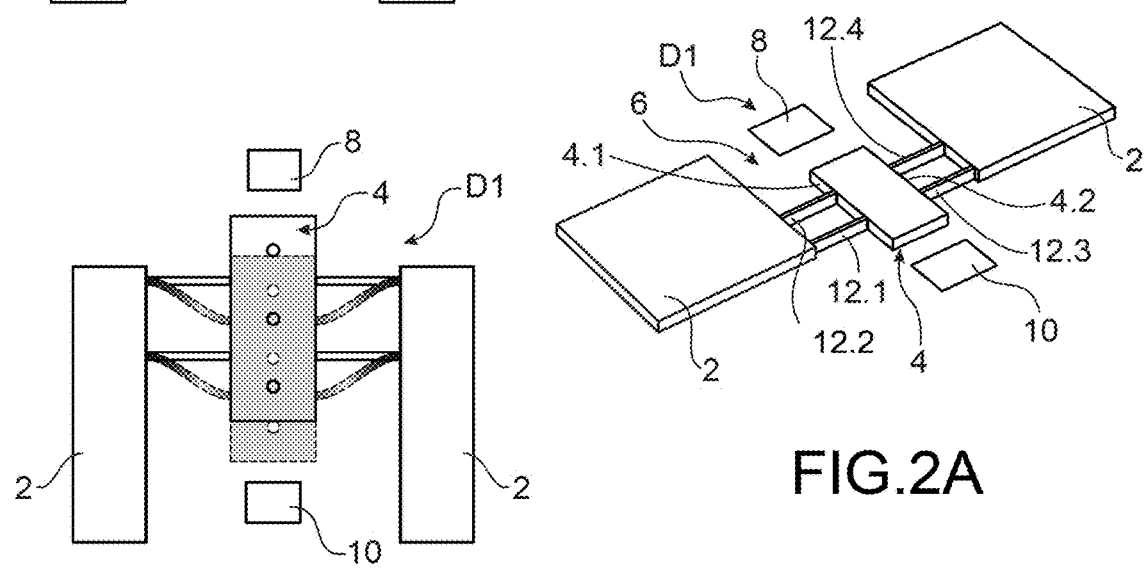
FIG.2A
FIG.3
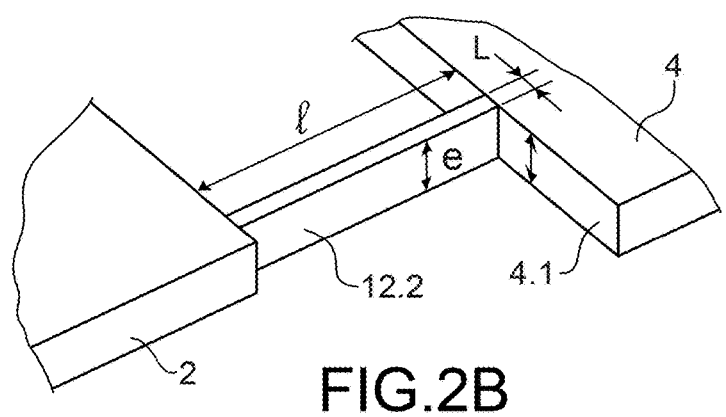
FIG.2B

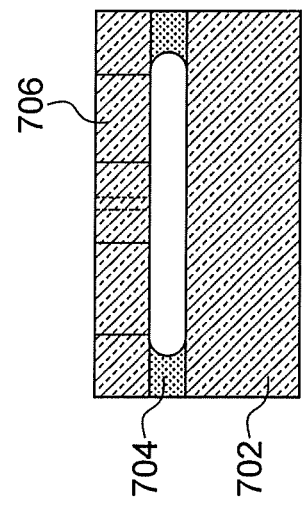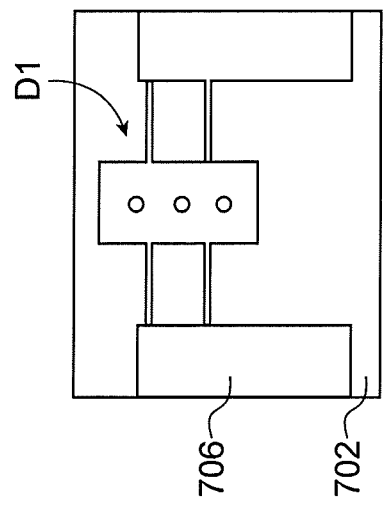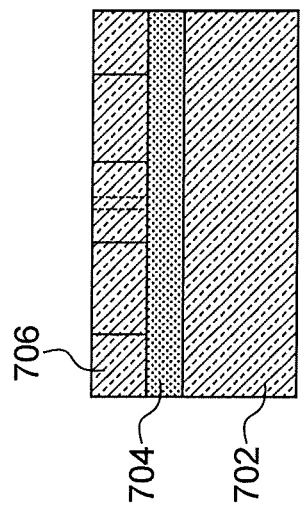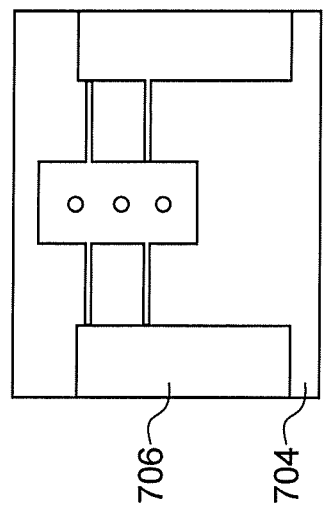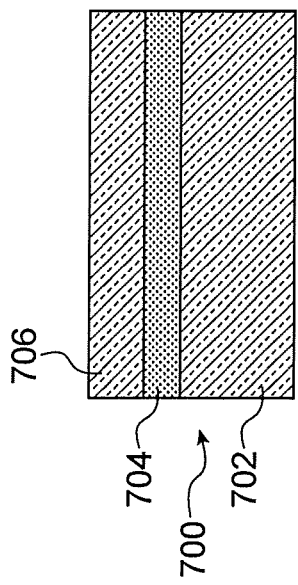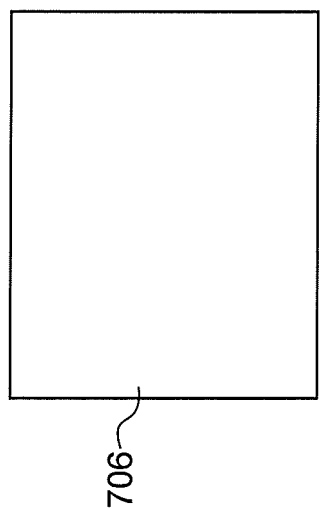
FIG. 12A  FIG. 12B  FIG. 12C

MICRO OR NANOMECHANICAL PARTICLE DETECTION DEVICE

TECHNICAL FIELD AND PRIOR ART

The present invention relates to a mechanical detection device implementing resonating micromechanical and/or nanomechanical structures.

The detection device may be used in gravimetric detection and more specifically in chemical sensors for gas detection, in biological sensors and in mass spectrometers based on resonating micromechanical and/or nanomechanical structures.

A mass spectrometer is a mass detector that makes it possible to determine the mass of individual particles. It is for example used in biology to determine the mass of biological cells. A resonating micro and/or nanomechanical system may be used in a mass spectrometer. The system comprises a beam or a structure able to receive for example a biological cell, the beam or the structure is excited at its resonance frequency. The deposition of a biological cell modifies the mass of the beam or the structure and thus modifies its resonance frequency. By measuring and by processing the variation in resonance frequency, corresponding to the deposition of each biological cell, it is possible to deduce therefrom the mass of the biological cell.

The document A. Rahafrooz and S. Pourkamali, "Fabrication and characterization of thermally actuated micromechanical resonators for airborne particle mass sensing: I. Resonator design and modeling," J. Micromechanics Microengineering, vol. 20, no. 12, p. 125018, 2010 describes a micromechanical resonator for the detection of the mass of particles in air. This resonator comprises a platform suspended at its four summits by four beams. Two of these beams are active, that is to say they are dedicated to the actuation and the detection of the movement of the platform. Each active beam is divided into two and is connected to two different electrodes, such that a current can circulate through the beam. Actuation is obtained by making a modulated current circulate in the beam and detection is obtained by detecting the current circulating through the beam due to the piezoresistive effect. Following actuation, the mass is made to vibrate in the plane. On the one hand, this device comprises beams of complex shape. Moreover they each require two electrical connections, which limits the minimum dimensions that can be attained for the device. The manufacture of this device is complex. On the other hand, the fact of making current circulate through the beam causes heating of the structure and modifies its properties. Moreover, this heating limits the choice of the materials suited to the production of the beams. In addition, this structure is not suited to an excitation and/or a detection of out of plane modes.

DESCRIPTION OF THE INVENTION

It is consequently an aim of the present application to offer a particle detection device having a simplified structure with respect to that of particle detection devices of the prior art.

The aforementioned aim is attained by a particle detection device comprising a platform, of which one face at least is intended to receive the particle(s) to detect, means for suspending the platform such that it can be made to vibrate, means for making said platform vibrate, the suspension means comprising at least two beams, said beams being configured to deform when the platform is made to vibrate, the beams and the platform being dimensioned so that, when the platform is made to vibrate, said platform is not or is little deformed by the action of the deformed beams. The detection device also comprises means for detecting the displacement of the platform.

Preferably, the beams have a length between the support and the platform at least ten times greater than the dimensions of the section of the beams. The dimension of the beams in the direction of the movement of vibration is at least ten times smaller than the dimension of the platform in this direction.

In exemplary embodiments of in plane and out of plane displacements of the platform, the beams are flexurally deformed.

In an exemplary embodiment, the detection means implement beams of suspension means which are for example made of piezoresistive material.

In another exemplary embodiment, the detection means are optical and comprise an optical resonator arranged near to the platform, such that the displacement of the platform modifies the optical properties of the resonator.

The subject matter of the present application is then a particle detection device comprising a support and at least one moveable structure with respect to the support, said moveable structure comprising a platform, of which one face at least is intended to receive the particle(s) to detect, means for suspending the platform such that the platform can be made to vibrate with respect to the support, means for making said platform vibrate at at least one of its resonance frequencies, means for detecting the displacement of the platform in a given direction, the suspension means comprising at least two beams configured to deform when the platform is made to vibrate. Each beam has a length l, a width L and a thickness e and the platform has a dimension in the direction of displacement of the platform. The dimension of each beam in the given direction of displacement of the platform is at least 10 times smaller than the dimension of the platform in the given direction of displacement, and in the case of a detection device with in plane mode $l \geq 10 \times L$ and in the case of a detection device with out of plane mode $l \geq 10 \times e$, such that, when the platform is made to vibrate, said platform is not or is little deformed by the action of the beams.

In an exemplary embodiment, the suspension means comprise at least one first beam and one second beam, the first and second beams being arranged symmetrically with respect to the direction of displacement.

In an example, the actuating means may be external to the moveable structure.

In another example, the actuating means may act directly on the platform. The actuating means may be optical means applying a gradient force at the resonance frequency to the platform or electrostatic means applying an electrostatic force at the resonance frequency to the platform.

In an exemplary embodiment, at least two beams are made of piezoresistive material, for example silicon, and the detection means comprise a constant voltage source intended to apply a potential difference to said beams, means for measuring a current at the output of said beams.

The detection means may comprise an optical resonator arranged near to the platform such that the displacement of the platform modifies an evanescent field of the optical resonator, a waveguide intended to inject a light beam into the optical resonator and to collect said light beam coming out of the optical resonator.

In an advantageous example, the detection device comprises several moveable structures arranged around the optical resonator, the displacement of each platform modifying the evanescent field of the optical resonator.

In an exemplary embodiment, the platform is rectangular and the two beams are fastened to a first side of greatest length of the platform and perpendicularly to said first side, two other beams are fastened to a second side of greatest length of the platform perpendicularly to said second side. The beams may be straight and parallel with each other.

The beams may be fastened to the first and second sides of greatest length at a distance from the longitudinal ends of the first and second sides of greatest length.

In an exemplary embodiment, the beams are made of a material different from that of the platform.

Another subject matter of the present application is a mass spectrometer comprising means for ionising an analyte, means for focusing the ionised analyte and at least one detection device described in the application arranged downstream of the focusing means.

BRIEF DESCRIPTION OF THE DRAWINGS

The present invention will be better understood on the basis of the description that follows and the appended drawings in which:

FIG. 1 is a top view of an exemplary embodiment of a detection device with in plane displacement mode, FIG. 2A is a perspective view of the detection device of FIG. 1, FIG. 2B is a detail view of FIG. 2A, FIG. 3 is a schematic representation of the device of FIG. 1 in excitation phase, FIGS. 12A to 12C are top and side view schematic representations of elements obtained during different steps of an example of method for producing a detection device of FIG. 1.

DETAILED DESCRIPTION OF PARTICULAR EMBODIMENTS

Figure 4:
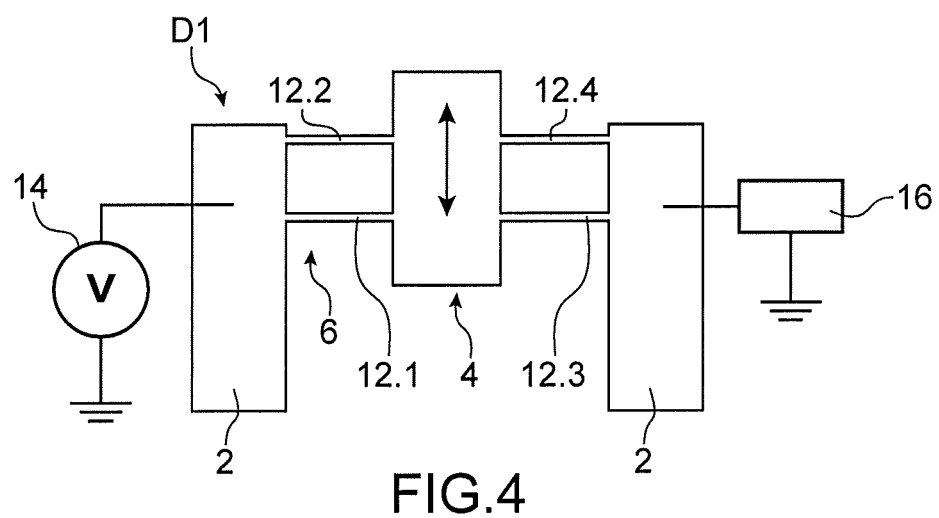
FIG. 4 is a top view of a detection device comprising piezoresistive detection means.

The resonating detection device according to the invention is intended to detect the presence of particles deposited on a receiving platform. The particles have for example dimensions of several nm. The particles may be biological particles (molecules, proteins, viruses, etc.), particles contained in air or gas.

In all the figures, the arrows represent the direction of displacement of the platform under the action of the actuating means.

As will be seen hereafter, the term "beam" designates at one and the same time rectilinear elements of constant transversal section, non-rectilinear elements, and elements of section that is variable continually and/or by portion.

In FIGS. 1 and 2A may be seen an exemplary embodiment of a detection device D1 with in plane mode according to the invention.

It comprises a support 2, a platform 4 for receiving particles, designated "platform", means for suspending 6 the platform 4 from the support 2, such that the platform 4 is able to be displaced with respect to the support 2. In this example, it is considered that the platform 4 is intended to be displaced in the plane XY of the device as is shown schematically in FIG. 3. Z is orthogonal to the plane XY and will be designated "out of plane direction".

The platform extends in a plane that is parallel to the plane XY of the detection device.

In the example represented in FIG. 1, the platform comprises openings which are used in certain manufacturing methods. These openings may be omitted.

The detection device also comprises actuating means 8 able to make the platform vibrate in the plane XY at at least one resonance frequency.

The device also comprises means for detecting 10 the displacement of the platform 4, more specifically variations in the displacement of the platform due to the deposition of a particle on the platform.

The suspension means comprise at least two beams. In the example represented, the suspension means 6 comprise four beams 12.1, 12.2, 12.3, 12.4.

Each beam 12 is anchored by one end to the support 2 and by another end to the platform 4.

In the example represented, the platform has a rectangular shape, two beams 12.1, 12.2 being anchored to the platform 4 along a first side 4.1 of the platform, and the two other beams 12.3, 12.4 are anchored to the platform along a second side 4.2 parallel to the first side.

In the example represented, the beams 12.1, 12.2 are anchored to the platform at a distance from the longitudinal ends of the first side 4.1 and the beams 12.3, 12.4 are anchored to the platform at a distance from the longitudinal ends of the second side 4.2. In an alternative, the beams are anchored to the platform at the level of the longitudinal ends of the second sides.

In this example, the beams 12.1 and 12.2 are parallel with each other and the beams 12.3 and 12.4 are parallel with each other, the beams 12.1 and 12.3 are aligned and the beams 12.2 and 12.4 are aligned and are parallel to the axis X.

In this example, the beams have a constant transversal section in a plane YZ.

The beams have a length l in the direction X, a width L in the direction Y and a thickness e in the direction Z (FIG. 2B).

The dimensions of the platform are designated a in the direction X and b in the direction Y.

As is shown schematically in FIG. 3, the platform 4 is intended to be displaced along the direction Y. The beams 12.1 to 12.4 are then flexurally deformed.

The moveable structure including the platform and the beams is dimensioned such that during displacement of the platform and deformation of the beams, the platform is not or is little deformed under the action of the beams.

To do so it is possible to choose:

(Ia)—For an in plane operation, the length l of the beams is equal to at least 10 times the width L of the beam:

$$l \geq 10 \times L.$$

(II)—The dimension of the beams in the direction of displacement of the platform is at least 10 times smaller than the dimension of the platform in the direction of displacement.

In the example of FIGS. 1 to 3, the direction of displacement is the direction Y in the plane, then $L \leq b/10$.

The platform may have dimensions, for example, of 100 nm×100 nm of surface up to 100 μm×100 μm, whatever the operating mode. The thickness of the platform may be for example from 10 nm to 100 μm.

The beams may for example have a section comprised between 25 nm×25 nm and 10 μm×10 μm; and a length comprised between 250 nm and 100 μm.

A non-limiting example of dimensions is given below. The device comprises a rectangular platform suspended by four beams for an in plane mode. The platform and the beams have a thickness in the direction Z of 220 nm. The platform has external dimensions of 3 μm×1.5 μm. The beams have a length in the direction X of 1.5 μm and a section of 100 nm×220 nm.

In another exemplary embodiment of a device adapted to an operation in out of plane mode, the platform has a surface of 3 μm×1.5 μm and a thickness of 300 nm. The supports have a length of 1 μm, a dimension L of 100 nm and a thickness e of 30 nm.

Thus the beams have a stiffness substantially less than the stiffness of the platform in the direction of displacement, which reduces the risks of deformation of the platform in the direction of displacement.

The mass Mm of the particle capable of being measured is much less than the mass of the platform Mp, advantageously Mm<Mp/10.

The minimum mass measurable by the detection device depends, for its part, on the performances of the detection device.

In an exemplary embodiment, the actuating means are external to the moveable structure and comprise a vibrating piezoelectric element, also called piezoshaker, to which is attached the support 2. When the piezoshaker is activated, the moveable structure is made to move with respect to the support. For example, if the mechanical actuation is at a resonance frequency, a mechanical amplification appears and the platform is displaced with respect to the support.

Figure 13:
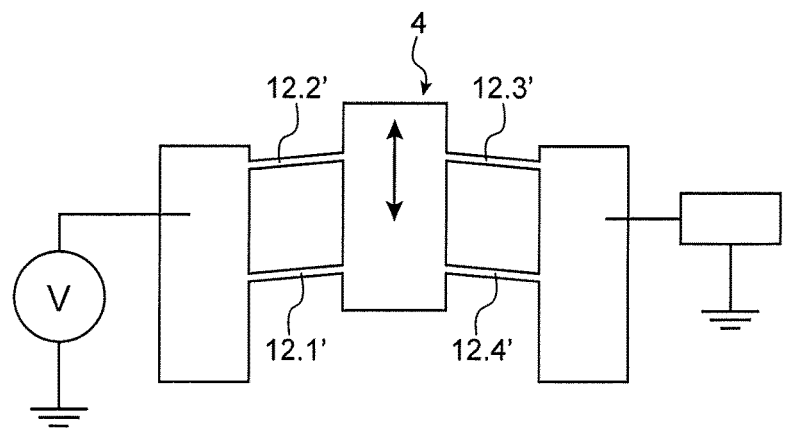
FIG. 13 is a schematically represented top view of an example of device according to the invention with thermal actuation.

In FIG. 13 may be seen another exemplary embodiment of a device suited to in plane mode, in which the actuating means are of thermal type. To do so a current circulates through the structure. The current mainly heats by Joule effect the beams, which are the most resistive elements on account of their small section. The heating causes an expansion of the supports, which brings about an in plane actuating force. The detection is piezoelectric. The beams 12.1' to 12.4' are oriented with respect to the edges of the platform 4 so as to form a non-right angle therewith.

A voltage at the frequency $f_{0/2}$ is considered.

The piezoresistive beams of resistance R see their resistance vary according to $R = R_0 + R_1 cps\, f_0$.

The displacement of the platform due to the thermal actuation is written:

$$x = x_0 \cos f_0.$$

The detection current at the output is:

$$I = I_1 \cos f_0/2 + I_1 \cos(f_0 - f_0/2) + I_1 \cos(f_0 + f_0/2).$$

$I_1 \cos (f_0 - f_0/2) + I_1 \cos (f_0 + f_0/2)$ is the current resulting from the movement of the structure.

In another exemplary embodiment, the actuating means are of electrostatic type. For example, it comprises an electrode on the support opposite one face of the platform and oriented such that an electrostatic force, generated between the electrode and the platform, displaces the platform in the direction Y. In the example of FIG. 1, the electrode is arranged facing one side 4.2. By applying a potential difference with a constant component and a second component at the resonance frequency between the electrode and the platform, an electrostatic force proportional to the square of the potential difference appears between the electrode and the platform, which is then made to vibrate at the resonance frequency. In an alternative, it is possible to envisage implementing two electrodes, each facing one side of the platform, the potential differences applied to the electrodes are then out of phase by a half-period.

According to another exemplary embodiment, the actuating means are of optical type. They comprise for example an optical resonator, for example of ring shape, arranged near to the platform. When the optical resonator is at resonance, a gradient force appears attracting the platform to the ring. The gradient force is modulated to the resonance frequency, causing the platform to vibrate. The optical ring(s) are placed opposite one side 4.2 in the example of FIGS. 1 to 3.

In FIGS. 4 and 5 may be seen examples of detection means that can be implemented in the detection device.

In FIG. 4, the detection means are of piezoresistive type. The detection means implement all or part of the beams 12.1 to 12.4 formed of a piezoresistive material. The beams are for example made of silicon.

In the example represented, the four beams are made of piezoresistive material and contribute to making the platform vibrate. In another example, only the beams 12.1 and 12.3 or 12.2 and 12.4 are made of piezoresistive material.

The detection means also comprise a source 14 of constant voltage V and means for measuring 16 the output current I.

In a homodyne mode, the constant voltage source is for example connected to the support to which are anchored the beams 12.1, 12.2, and the means for measuring 16 the output current are connected to the support to which are anchored the beams 12.3, 12.4.

For example, assuming a displacement of the platform along the direction Y: $y = y_0 \cos f_0$, $f_0$ being the resonance frequency, then the resistance R of the piezoresistive beams varies according to the following relationship:

$$R = R_0 + R_1 \cos 2f_0.$$

The result is that the output current may be written $I = I_0 I_1 \cos 2f_0$.

If a thermal actuation is combined with a piezoresistive detection, the resistance of the supports varies according to the relationship $R=R_0+R_1 \cos f_0$, because the beams form an angle with the edges of the platform. In this case, the current that traverses the structure is at frequency $f_0/2$ due to the thermal actuation, in such a way that the output current has terms at three different frequencies: at that of the actuating frequency, and two additional components which only appear when the structure is in resonance. These components may be measured using heterodyne detection methods or instead a spectrum analyser.

If a particle is deposited on the platform, the resonance frequency is modified, causing a variation in R and a variation in I. By processing this variation, it is possible to work back to the mass of the deposited particle.

In an alternative, it is possible to carry out a heterodyne detection, by implementing a voltage source modulated to a certain frequency, the frequency of the output current being known and fixed.

The implementation of piezoelectric detection means has the advantage of being of reduced bulk, which makes it possible to optimise the capture surface on a same chip.

Figure 5A:
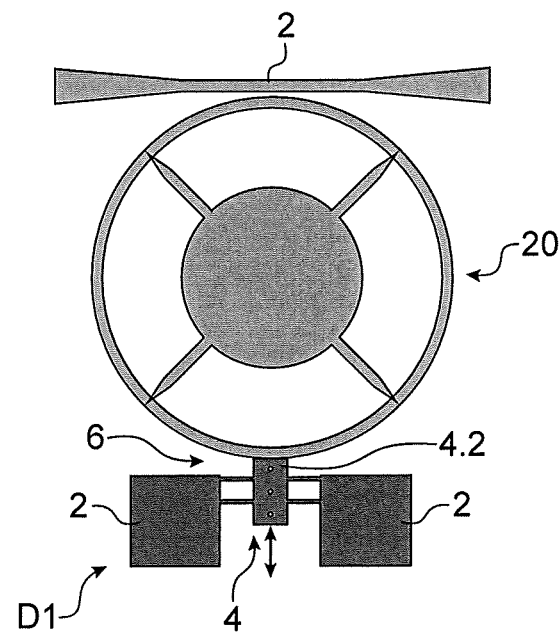
FIG. 5A is a top view of an example of detection device with in plane displacement comprising optical detection means.

In FIG. 5A may be seen another exemplary embodiment of detection means, in which the detection means are of optical type, adapted to a device having an in plane mode.

In the example represented, the detection means comprise an optical device including at least one waveguide 18 and one ring-shaped optical resonator 20, which is coupled to the waveguide 18 by evanescent coupling. The optical device also comprises a light source, for example a laser (not represented) optically coupled to the waveguide 18.

The optical ring 20 is attached to the support 2 and situated near to the platform, such that one edge at least of the platform is in the evanescent field of the ring and that the displacement of the ring influences the evanescent field. For example, the distance between the ring and one edge of the platform is of the order of 100 nm.

The orientation of the ring with respect to the platform is such that when the platform is made to vibrate, the distance between the ring and the platform varies, while remaining within the perimeter of the evanescent field.

A light wave of constant intensity is injected into the optical ring. The displacement of the platform near to the ring modifies the optical properties of the ring, of which its optical resonance frequency, the luminous intensity recovered by the waveguide 18 is then modulated due to the influence of the displacement of the platform on the optical properties of the ring. By using spectrometric means, it is possible to obtain an output intensity of the light beam proportional to the displacement of the platform.

For a platform having a displacement along the direction Y $\gamma=\gamma_0 \cos f_0$, considering at the inlet of the waveguide, a luminous intensity $P_{in,\lambda 0}$ at a constant wavelength $\lambda_0$, the output intensity $P_{out,\lambda 0}$ is modulated into $P_1+P_2 \cos f_0$.

In an alternative, the optical detection means comprise an external laser and interferometric detection means.

In an alternative, it is possible to envisage arranging several platforms around a same optical ring, each platform being optically coupled to the ring. By implementing platforms of different resonance frequencies, it is possible after processing to separate the influences of the different platforms on the optical properties of the ring and thereby to work back to the mass of each particle deposited on each platform. This device makes it possible to detect simultaneously several particles, the device then offers quicker detection.

An example of operation of the detection device according to the invention will now be described.

The actuating means 8, for example optical or electrostatic, are activated so as to make the platform 4 vibrate along the direction Y, at one of its resonance frequencies, the beams 12.2 to 12.4 are flexurally deformed as is represented in FIG. 3. Due to the dimensions of the beams and the platform, the deformations of the beams do not have or have little mechanical effect on the platform, said platform is little deformed or is not deformed.

The detection means, for example optical or piezoelectric, detect the vibratory displacement of the platform.

When a particle is deposited on the platform, the particle and platform taken together have a resonance frequency different to that of the platform alone. The detection means detect the modified vibratory displacement of the platform bearing the particle.

The variation in resonance frequency is next processed and makes it possible to determine the mass of the deposited particle.

The detection device is integrated in a detection system comprising means for processing measurement signals supplied by the detection device, in order to supply the mass of the deposited particle, or even the designation of the deposited particle.

Thanks to the invention, whatever the place of the platform where the particle is deposited, the influence on the resonance frequency is the same or virtually the same. Thus a single resonance mode suffices to detect a particle whatever its location on the platform.

Figure 14:
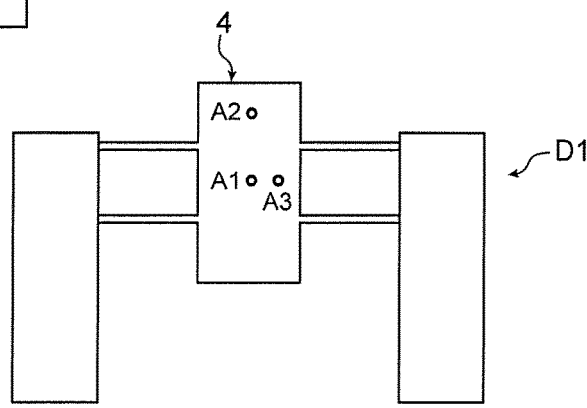
FIG. 14 is a view identical to that of the FIG. 1 with particles deposited on the platform.

In FIG. 14 may be seen a device according to FIG. 1. Particles A1, A2, A3 have been shown schematically at different locations of the platform. A simulation by finite elements gives the following results:

For particles of mass $m_1$:
the deposition of the particle A1 causes a frequency shift $$\frac{\Delta f_1}{f_0} = 1082.1 \text{ ppm};$$

the deposition of the particle A2 causes a frequency shift $$\frac{\Delta f_2}{f_0} = 1082.5 \text{ ppm};$$

the deposition of the particle A3 causes a frequency shift $$\frac{\Delta f_3}{f_0} = 1082.0 \text{ ppm};$$

It is thus observed that, thanks to the invention, the frequency shift due to the deposition of a particle on the platform varies little as a function of the location of deposition.

For a mass $m_2=m_1/2$ kg, the simulation gives for the particle A1

$$\frac{\Delta f_1}{f_0} = 541 \text{ ppm}.$$

By dividing the mass by two, the frequency shift is divided by around two.

The surface of the platform may be very large and may be adjusted as a function of the applications.

The resonance frequency of the platform is easily adjusted by choosing the dimensioning of the beams of the suspension means, independently of the shape of the platform.

In the example represented in FIGS. 1 to 3, the beams are parallel with each other. According to another example of device D2 represented in FIG. 6, the suspension beams of the platform 104 may be oriented such that their longitudinal axes are secant. In the example represented, the beams 112.1 and 112.2 and the beams 112.3 and 112.4 are arranged symmetrically with respect to the axis Y.

Figures 6, 7:
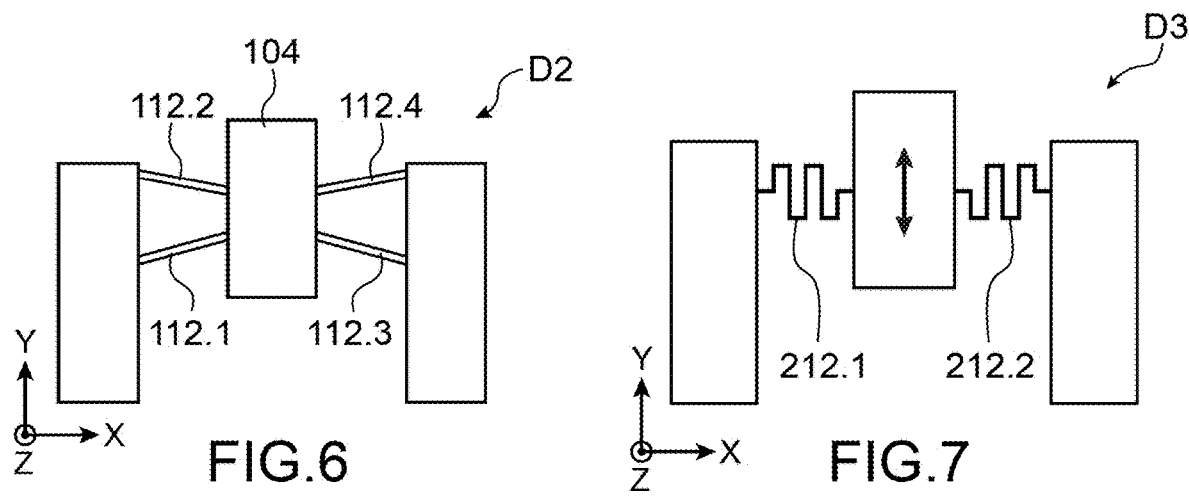
FIG. 6 is a top view of another exemplary embodiment of the device of FIG. 1.
FIG. 7 is a top view of another exemplary embodiment of the device of FIG. 1, FIGS. 8A to 8D are top views of alternative embodiments of the device according to the invention.

Moreover, the beams 212.1, 212.2 may have a shape other than a rectilinear shape, for example they may have a spring shape, as is visible in the device D3 represented in FIG. 7. In this case, the length to take into account in the inequalities l≥10×L and l≥10×e is the length of the developed spring.

Moreover, the beams may have a transversal section of surface that is variable continually or by portion. In this case, the inequalities (I) consider the maximum values of L and e, and the inequalities (II) consider the minimum value of e.

Figure 8A:
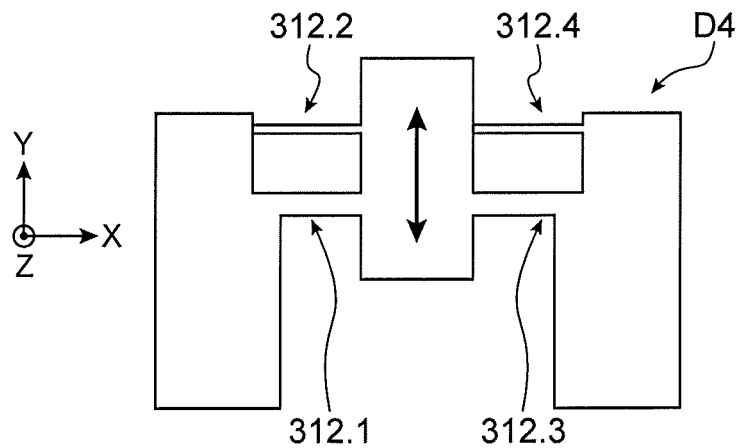

In addition, the beams could not all have the same length, as is represented in FIG. 8A, in which the beams 312.1 and 312.3 of the device D4 are shorter than the beams 312.2 and 312.4.

Figure 8B:
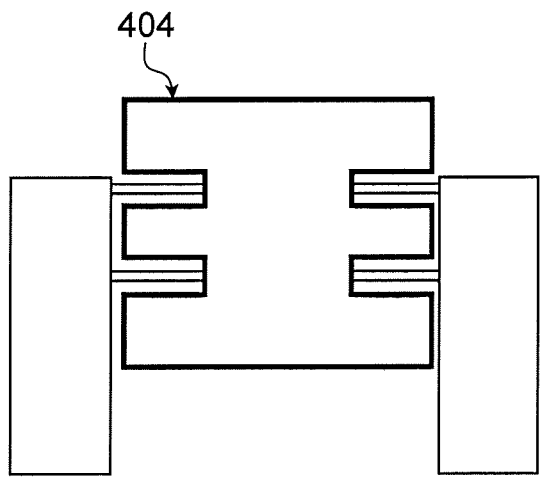

In FIG. 8B may be seen an alternative of the device D1 in which the platform 404 comprises hollowing outs 414 in the direction X, for each of the beams and at the bottom of which one end of the beams 412.1 to 412.4 is anchored.

Figure 8C:
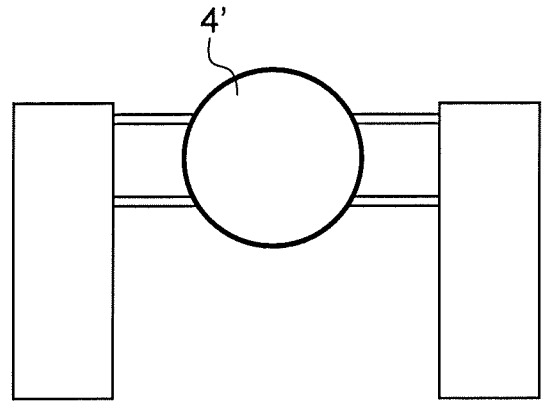

In FIG. 8C may be seen another alternative of the device D1 comprising a disc shaped platform 4'.

Figure 8D:
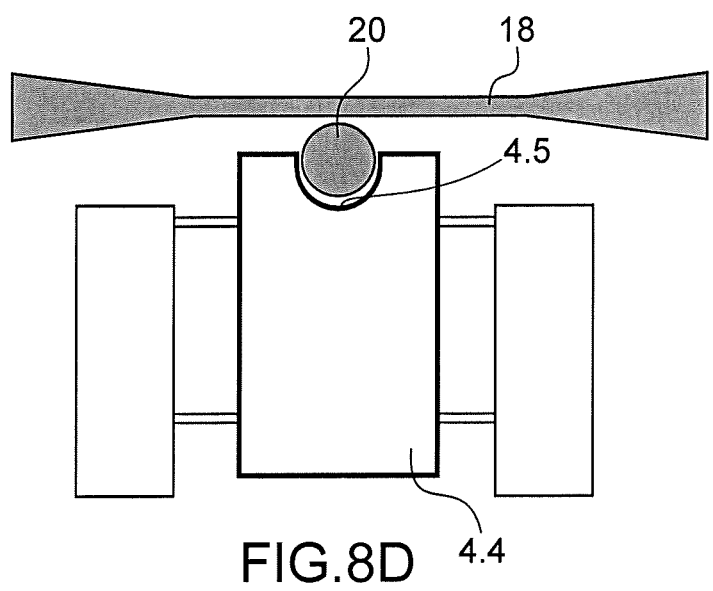

In FIG. 8D may be seen an alternative of the device with optical actuation or detection. In this example, an edge of the platform 4" has a hollowing out 4.5 of shape corresponding to the optical disc to house said disc. The optical disc 20 is partially lined by an arc shaped edge of the platform.

It will also be understood that the number of beams is not limited to four, it may be envisaged to provide six beams or more. Preferably, the beams are distributed symmetrically with respect to the direction of displacement to obtain a uniform displacement of the platform.

Figure 9:
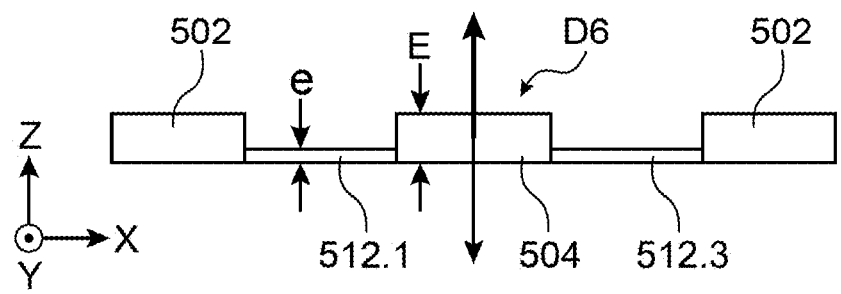
FIG. 9 is a side view of a detection device according to another embodiment with out of plane displacement mode.

In another exemplary embodiment of a detection device D6, the platform is excited such that it has an out of plane movement, i.e. along the axis Z, as is shown schematically in FIG. 9.

The moveable structure including the platform and the beams is dimensioned such that during the displacement of the platform and the deformation of the beams, the platform is not or is little deformed under the action of the beams.

To do so, for the beams 512A to 512.4 connecting the platform 504 to the supports 502 the following are chosen:
  Ib—For an out of plane operation for which an example of device will be described below, the length l of the beams is equal to at least 10 times the thickness e of the beam:

$$l \geq 10 \times e.$$

The condition II is written L≤10×E, with E the thickness of the platform in the direction Z.

According to the invention, the platform is displaced along the axis Z without flexurally deforming.

The actuating means able to make the platform 404 move along the direction Z may be the same as those implemented to generate an in plane displacement. In the case of a piezoelectric shaker, said shaker is such that it displaces the support in the direction Z.

Figure 5B:
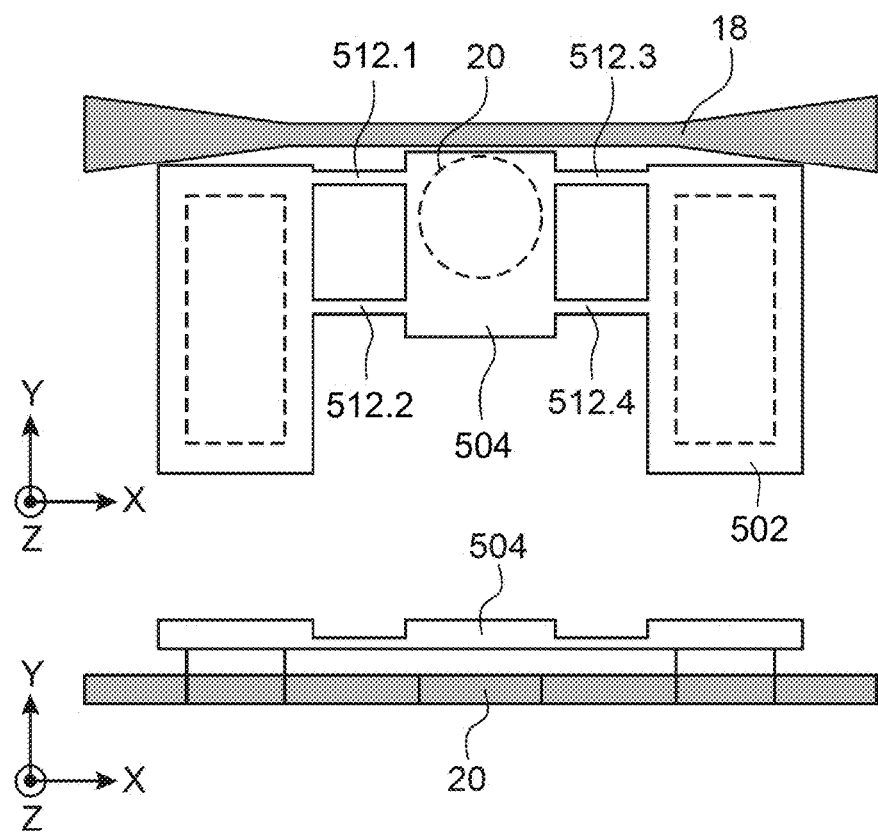
FIG. 5B is a top view of an example of device with out of plane mode comprising optical means being able to serve for actuation or for detection.

In FIG. 5B may be seen an example of device with out of plane mode comprising optical means that can serve for actuation or detection.

The detection means comprise an optical ring arranged under the platform and a waveguide 18 in the plane of the ring. In the case of an implementation for detection, the displacement of the platform along the direction Z, near to the ring, modifies the optical properties of the ring, of which its optical resonance frequency. The luminous intensity recovered by the waveguide 18 is then modulated due to the influence of the displacement of the platform on the optical properties of the ring. In this example, the platform advantageously protects the optical ring from the deposition of mass, which avoids effects of added mass on the optical response.

The detection means able to detect the displacement of the platform may be similar to those implemented for the detection of in plane displacements.

Figure 10:
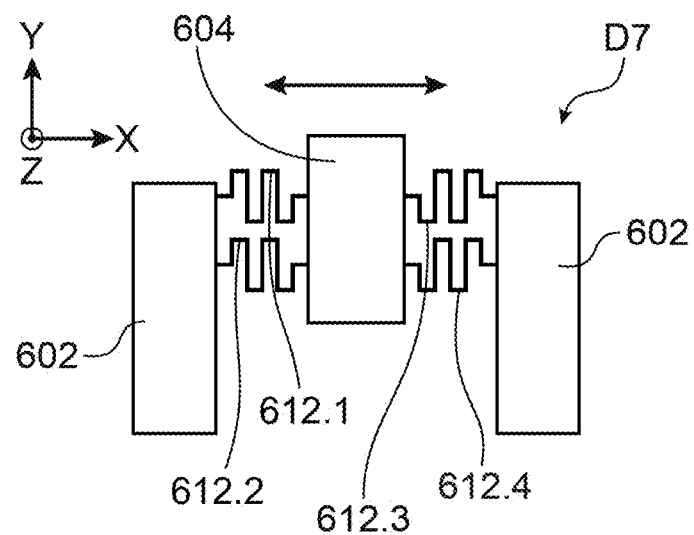
FIG. 10 is a top view of a detection device according to yet another embodiment.

According to another exemplary embodiment, the platform 604 may be excited according to transversal modes in plane with respect to the support 602, i.e. modes in which the direction of movement corresponds to the longitudinal direction of the beams 612.1 to 612.4, i.e. along the direction in the representation of FIG. 10. The beams preferably have a spring shape.

Figure 11:
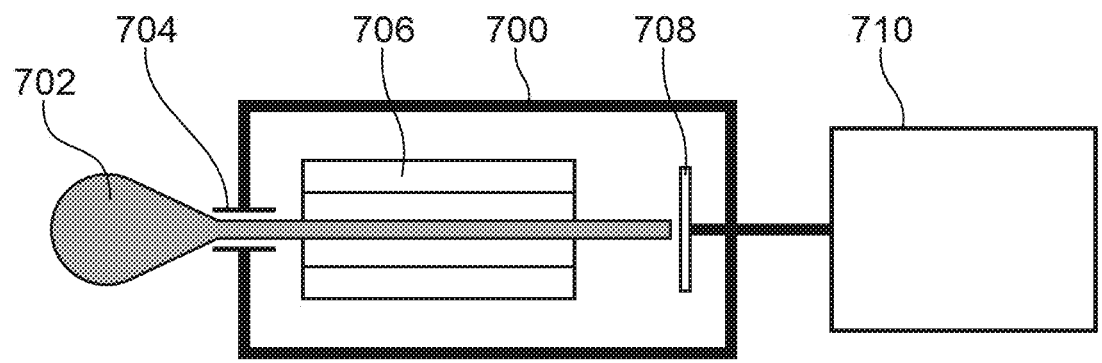
FIG. 11 is a schematic representation of a mass spectrometer implementing a detection device according to the invention.

In FIG. 11 may be seen a schematic representation of a mass spectrometer implementing the detection device according to the invention.

The mass spectrometer comprises a vacuum chamber 700 supplied by a source of analyte 702, means for ionising 704 the analyte at the inlet of the chamber 700, means for focusing 706 the ionised analyte downstream of the ionisation means and a mass sensor 708 according to the invention downstream of the focusing means. The sensor is connected to means for measuring and processing the signal 710 transmitted by the sensor 708.

An example of method for manufacturing a detection device of FIGS. 1 to 3 will now be described in relation with FIGS. 12A to 12C.

Preferably, the detection device may be produced by microelectronic techniques.

For example, a SOI (Silicon On Insulator) substrate 700 comprising a silicon substrate 702, a $SiO_2$ layer 704 and a silicon layer 706 is used. This substrate is represented in side view and in top view in FIG. 12A.

During a following step, the layer 706 is structured, for example by photolithography and etching, so as to form the moveable structure in the layer 706 having dimensions suited to the beams and the platform to ensure a small deformation, or even an absence of deformation of the platform when it is made to vibrate.

The element thereby obtained is represented in side view and in top view in FIG. 12B.

During a following step, the moveable structure is freed, for example by anisotropic wet etching of the $SiO_2$ 704.

The element thereby obtained is represented in side view and in top view in FIG. 12C.

It will be understood that the moveable structure may be made of another material, such as gallium, silicon nitride or aluminium.

Moreover, in the example describes the platform and the beams are made of the same material. In another example, they are made of different materials, having for example different mechanical properties. For example, it is possible to make the platform of a material having a greater stiffness and the beams having a lower stiffness, for example by choosing a material with a higher Young's modulus for the platform than for the beams. For example, it is possible to choose in the case of a device with in plane displacement Ebeam×L<<Eplatform×b, and in the case of a device with out of plane displacement Ebeam×e<<Eplatform×E With Ebeam the Young's modulus of the material of the beam, Eplatform the Young's modulus of the material of the platform and E the thickness of the platform.

Moreover, it is possible to envisage producing the stack of FIG. 12A, and not from a stack already produced.

The minimum size of the detection device depends on the manufacturing method and on its aptitude to produce beams of small section. For example, if the manufacturing technology limits the minimum dimension of an element to 50 nm, the smallest section of the beams may be 50 nm×50 nm, the result is that the length of the beams is at least 500 nm, and the platform has at least one minimum dimension of 500 nm in the direction of movement.

Figure 15A:
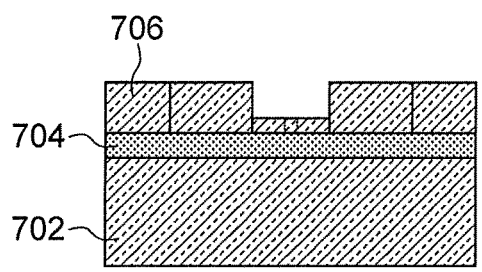
FIGS. 15A and 15B are schematic top view and side view representations of elements obtained during different steps of an example of method for producing an alternative of the detection device of FIG. 1, FIGS. 16A and 16B are schematic top view and side view representations of elements obtained during different steps of an example of method for producing a detection device of FIG. 9.
Figure 15B:
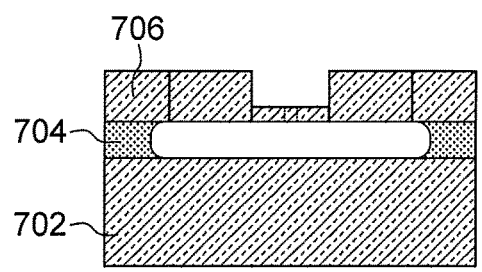

In FIGS. 15A and 15B may be seen schematically represented the steps making it possible to produce a device with in plane mode, in which the platform is thinned and the beams are thick.

Firstly the steps of FIGS. 12A and 12B are carried out, then a photolithography and an etching of the platform are carried out so as to thin it.

The element thereby obtained is represented in FIG. 15A.

During a following step, the moveable structure is freed, for example by wet anisotropic etching of the SiO$_2$ 704.

The element thereby obtained is represented in side view in FIG. 15B.

Figure 16A:
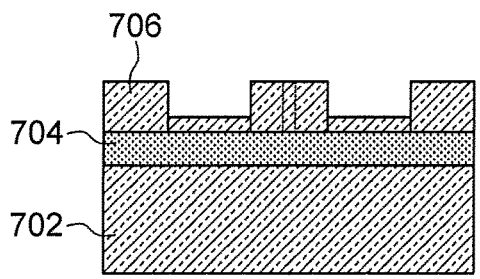
Figure 16B:
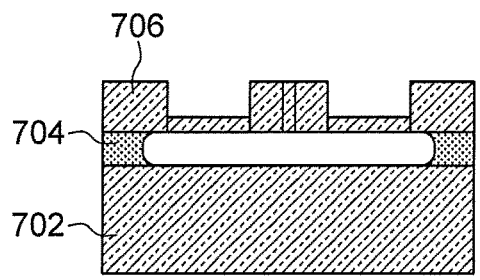

In FIGS. 16A and 16B may be seen represented schematically the steps making it possible to produce a device with out of plane mode (FIG. 9), in which the beams are thinned with respect to the platform.

The steps of FIGS. 12A and 12B are firstly carried out, a photolithography and an etching of the beams are then carried out so as to thin them.

The element thereby obtained is represented in FIG. 16A.

During a following step, the moveable structure is freed, for example by anisotropic wet etching of the SiO$_2$ 704.

The element thereby obtained is represented in side view in FIG. 16B.

The invention claimed is:

1. A particle detection device comprising
a support,
at least one moveable structure with respect to the support, said moveable structure comprising a platform, of which one face at least is configured to receive the particle(s) to detect,
suspension means for suspending the platform such that the platform is able to vibrate with respect to the support,
at least one actuator for making said platform vibrate at at least one of its resonance frequencies, and
at least one detector for detecting displacement of the platform in a given direction,
the suspension means comprising at least two beams, configured to deform when the platform is made to vibrate, wherein
the at least one detector is configured to detect the variations in displacement of the platform due to a presence of at least one particle on the platform,
each beam has a length l, a width L and a thickness e and the platform has a dimension in the direction of displacement of the platform, the dimension of each beam in the given direction of displacement of the platform is at least 10 times smaller than the dimension of the platform in the given direction of displacement, and
in the case of the particle detection device with in plane mode l≥10×L and in the case of the particle detection device with out of plane mode l≥10×e.

2. The particle detection device according to claim 1, wherein the suspension means comprises at least one first beam and one second beam, the first and second beams being arranged symmetrically with respect to the direction of displacement.

3. The particle detection device according to claim 1, wherein the at least one actuator is external to the moveable structure and not in contact with the suspension means.

4. The particle detection device according to claim 1 wherein the at least one actuator is directly on the platform.

5. The particle detection device according to claim 4, wherein the at least one actuator is an optical actuator applying a gradient force to the platform or an electrostatic actuator applying an electrostatic force to the platform.

6. The particle detection device according to claim 1, wherein:
at least two beams are made of piezoresistive material, and
the at least one detector comprises a constant voltage source configured to apply a potential difference to said beams.

7. The particle detection device according to claim 6, in which at least two beams are made of silicon.

8. The particle detection device according to claim 6, wherein the piezoelectric material comprises silicon.

9. The particle detection device according to claim 6, comprising a device for measuring a current at an output of said beams.

10. The particle detection device according to claim 1, wherein the at least one detector comprises:
an optical resonator arranged near to the platform such that the displacement of the platform modifies an evanescent field of the optical resonator, and
a waveguide intended to inject a light beam into the optical resonator and to collect said light beam coming out of the optical resonator.

11. The particle detection device according to claim 10, comprising several moveable structures arranged around the optical resonator, the displacement of each platform modifying the evanescent field of the optical resonator.

12. The particle detection device according to claim 1, wherein:
the platform is rectangular,
two beams are fastened to a first side of greatest length of the platform and perpendicularly to said first side,
two other beams are fastened to a second side of greatest length of the platform perpendicularly to said second side, and
the beams are straight and parallel with each other.

13. The particle detection device according to claim 12, wherein the beams are fastened to the first and second sides of greatest length at a distance from the longitudinal ends of the first and second sides of greatest length.

14. A mass spectrometer comprising an ioniser for ionising an analyte, focusing means for focusing the ionised analyte and at least one particle detection device according to claim 1, which is arranged downstream of the focusing means.

15. The particle detection device according to claim 1, wherein said platform is configured to, when the platform is made to vibrate, not to be deformed by action of the beams.

16. The particle detection device according to claim 1, wherein said platform is configured to, when the platform is made to vibrate, be little deformed by action of the beams.

17. The particle detection device according to claim 1, wherein the least one actuator device is configured to act directly on the platform.

18. The particle detection device according to claim 1, wherein the suspension means is connected to the platform and is made of a material different from that of the platform.

19. A particle detection device comprising:
a support,
a rectangular platform configured to vibrate with respect to the support and having a face configured to receive at least one particle to detect,
at least one actuator for making said platform vibrate at at least one of its resonance frequencies,
at least one detector for detecting displacement of the platform in a given direction, and
four beams, configured to deform when the platform is made to vibrate and made of a type of material different from that of the platform, wherein:
each beam has a linear rectangular shape with first and second ends,
the first end of each of first and second ones of the beams is connected to a first long side of the platform,
the first end of each of third and fourth ones of the beams is connected to a second long side of the platform opposite to the first long side,
the second ends of each of the beams are connected to the support.

20. The particle detection device according to claim 19, wherein the at least one actuator is not in contact with the platform and each of the beams.

21. The particle detection device according to claim 18, wherein:
the third and fourth ones of the beams are parallel to each other, and
the first and second ones of the beams are parallel to each other.

22. The particle detection device according to claim 19, wherein the least one actuator device is configured to act directly on the platform.

23. The particle detection device according to claim 19, wherein the at least one detector is configured to detect the variations in displacement of the platform due to the presence of at least one particle on the platform.

* * * * *